United States Patent
Yeh

(10) Patent No.: US 8,283,230 B2
(45) Date of Patent: Oct. 9, 2012

(54) FABRICATION METHOD OF SELF-ALIGNED TRENCHED POWER SEMICONDUCTOR STRUCTURE

(76) Inventor: Chun Ying Yeh, Hsinchu (TW)

( * ) Notice: Subject to any disclaimer, the term of this patent is extended or adjusted under 35 U.S.C. 154(b) by 358 days.

(21) Appl. No.: 12/797,898

(22) Filed: Jun. 10, 2010

(65) Prior Publication Data

US 2011/0306194 A1 Dec. 15, 2011

(51) Int. Cl.
*H01L 21/336* (2006.01)

(52) U.S. Cl. ........ 438/270; 438/229; 438/259; 438/700; 257/382

(58) Field of Classification Search ............... 438/229, 438/259, 270, 700; 257/382
See application file for complete search history.

(56) References Cited

U.S. PATENT DOCUMENTS

| 6,057,194 A * | 5/2000 | Fulford et al. ............... 438/270 |
| 6,312,989 B1 * | 11/2001 | Hsieh et al. .................. 438/257 |
| 6,359,309 B1 * | 3/2002 | Liao et al. ..................... 257/341 |
| 6,838,734 B2 * | 1/2005 | Ker et al. ...................... 257/360 |
| 6,965,146 B1 * | 11/2005 | Wu .................................. 257/328 |
| 2003/0008450 A1 * | 1/2003 | Tsai et al. ..................... 438/200 |

* cited by examiner

*Primary Examiner* — Jarrett Stark
*Assistant Examiner* — Nicholas Tobergte
(74) *Attorney, Agent, or Firm* — Muncy, Geissler, Olds & Lowe, PLLC

(57) ABSTRACT

A fabrication method of a self-aligned power semiconductor structure is provided. Firstly, a trenched polysilicon gate is formed in a silicon substrate. Then, a self-aligned polysilicon extending structure is formed on the trenched polysilicon gate. A width of the self-aligned polysilicon extending structure is smaller than that of the trenched polysilicon gate. Thereafter, the self-aligned polysilicon extending structure is oxidized to form a silicon oxide protruding structure on the trenched polysilicon gate. Then, a first spacer is formed on a sidewall of the silicon oxide protruding structure to define a source contact window.

13 Claims, 7 Drawing Sheets

FABRICATION METHOD OF SELF-ALIGNED TRENCHED POWER SEMICONDUCTOR STRUCTURE

BACKGROUND OF THE INVENTION (1) Field of the Invention

This invention relates to a fabrication method of a trenched power semiconductor structure, and more particularly relates to a fabrication method of a self-aligned trenched power semiconductor structure.

(2) Description of the Prior Art

FIGS. 1A to 1C are schematic views showing a fabrication process of a typical trenched power semiconductor structure. As shown in FIG. 1A, firstly, a gate trench 120 is formed in a silicon substrate 110. Then, a gate oxide layer 130 is formed to line the inner surface of the gate trench 120. Afterward, a polysilicon layer is deposited on the upper surface of the silicon substrate 110 and an etching back step follows to remove the unwanted portion of the polysilicon layer so as to leave a polysilicon gate 140 in the gate trench 120.

After the formation of the polysilicon gate 140, as shown in FIG. 1B, a body implantation step is carried out to implant dopants into the silicon substrate 110 so as to form a body 150 surrounding the gate trench 120. Then, a source implantation step is carried out to implant dopants of different conductive type into the body 150 so as to form the source region 160 in the upper portion of the body 150. Thereafter, as shown in FIG. 1C, a dielectric layer 170 is deposited on the exposed surfaces of the silicon substrate 110 and fills the gate trench 120. Then, a contact window 180 for exposing the source region 160 is formed in the dielectric layer 170 and the body 150 by using lithographic and etching processes.

It is noted that the shrinkage of cell dimension of the trenched power semiconductor device is restricted by lithographic limitations. That is, due to the limitations of critical dimension for trench and contact window as well as tolerance required for alignment control, the distance between the gate trench 120 and the contact window 180 should be great enough to prevent the problems such as leakage current, variation of threshold voltage, or decreasing of avalanche ruggedness.

Accordingly, how to increase cell density of trenched power semiconductor structure under the limitations of critical dimension for trench and contact window as well as tolerance required for alignment control is an important issue to be resolved.

SUMMARY OF THE INVENTION

It is an object of the present invention to provide a high-density trenched power semiconductor structure and the fabrication method thereof, which applies the technology of self-alignment to overcome the limitations of critical dimension for the gate trench and the contact window as well as tolerance for alignment control.

A fabrication method of a self-aligned power semiconductor structure is provided. The fabrication method comprises the steps of: a) forming a trenched polysilicon gate in a silicon substrate; b) forming a self-aligned polysilicon extending structure, extended upward from the trenched polysilicon gate, a width of the self-aligned polysilicon extending structure being smaller than that of the trenched polysilicon gate; c) oxidizing the self-aligned polysilicon extending structure to form a silicon oxide protruding structure on the trenched polysilicon gate; and d) forming a first spacer on a sidewall of the silicon oxide protruding structure to define a source contact window.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The main feature of the present invention is to apply the level difference resulted from the hard mask or the poly etching back process to form spacers above the polysilicon gate, and adapts the space defined by the spacers to form a polysilicon protruding structure with a smaller width. The polysilicon protruding structure is then oxidized by using thermal oxidation process to form a silicon oxide protruding structure. The level difference resulted from the silicon oxide protruding structure can be utilized to form spacers for defining the location of contact window. Thus, the problem of alignment error can be prevented.

Figure 1A:
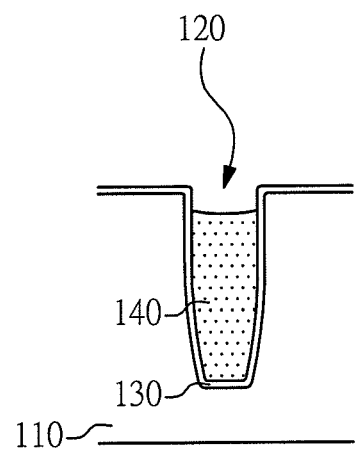
FIGS. 1A to 1C are schematic views showing a fabrication method of a typical trenched power semiconductor structure.
Figure 1B:
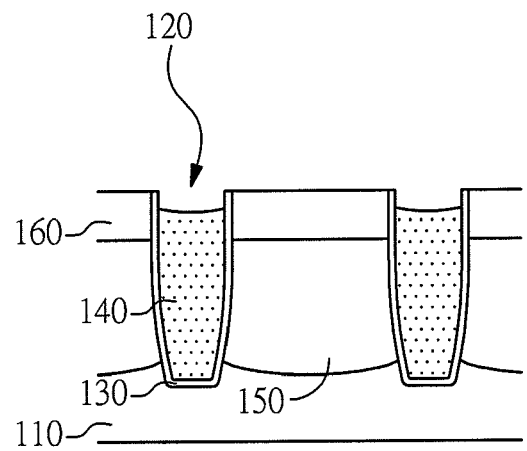
Figure 1C:
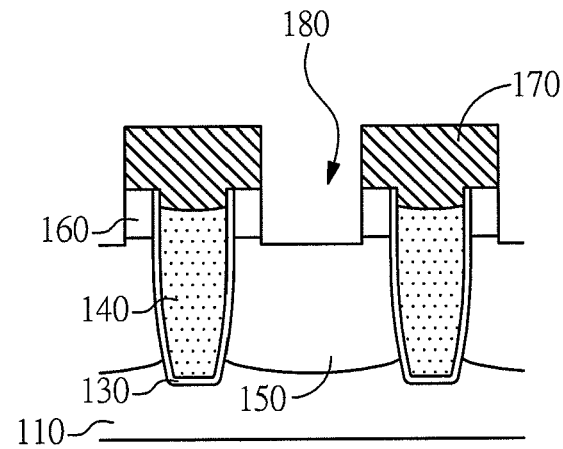
Figure 2A:
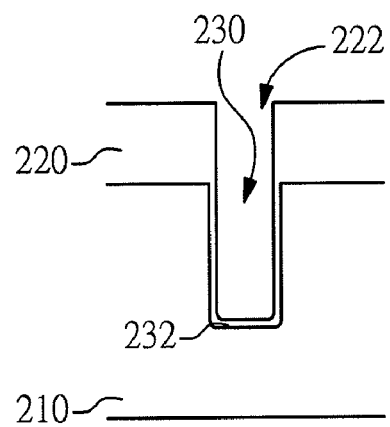
FIGS. 2A to 2I are schematic views showing a fabrication method of a trenched power semiconductor structure in accordance with a first embodiment of the present invention.
Figure 2B:
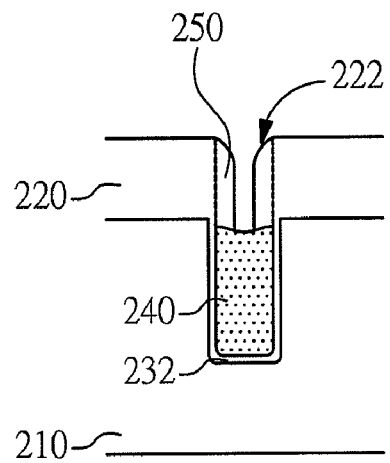

FIGS. 2A to 2I are schematic views showing a fabrication method of a trenched power semiconductor structure in accordance with a first embodiment of the present invention. As shown in FIG. 2A, firstly, a mask layer 220 is formed on an upper surface of a silicon substrate 210. The mask layer 220 has an open 222 to define at least a gate trench 230. The typical hard mask, which is made by silicon oxide or silicon nitride, can be applied in the present embodiment as the mask layer 220. Then, the silicon substrate 210 is etched with the mask layer 220 as an etching mask to form the gate trench 230 in the silicon substrate 210. Afterward, a gate dielectric layer 232 is formed to line the inner surface of the gate trench 230. Then, as shown in FIG. 2B, a polysilicon layer is deposited on the silicon substrate 210 and fills the gate trench 230, and an etching back step follows to remove the unwanted polysilicon material and leave the trenched polysilicon gate 240 within the gate trench 230.

Figure 2C:
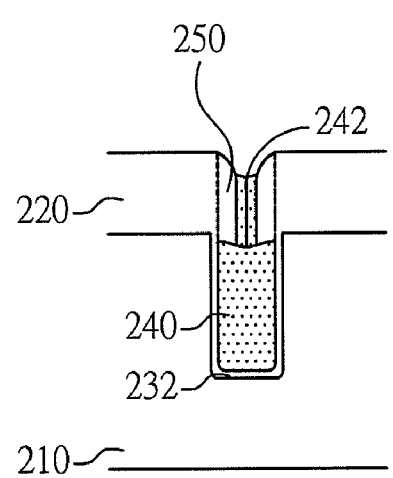

Referring to FIG. 2B, after the formation of the trenched polysilicon gate 240, a (second) spacer 250 is formed on the sidewall of the open 222 in the mask layer 220. The second spacer 250 is extended from the upper surface of the trenched polysilicon gate 240 upward. Thereafter, as shown in FIG. 2C, the space defined by the second spacer 250 is filled with polysilicon material so as to form a self-aligned polysilicon extending structure 242 above the trenched polysilicon gate 240. The self-aligned polysilicon extending structure 242 is substantially aligned to the center of the trenched polysilicon gate 240. In addition, the formation of the second spacer 250 guarantees the width of the self-aligned polysilicon extending structure 242 being smaller than that of the trenched polysilicon gate 240.

Figure 2D:
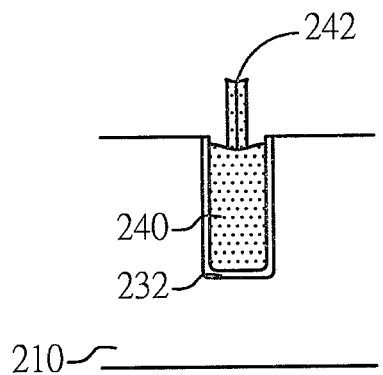

Next, as shown in FIG. 2D, the mask layer 220 and the second spacer 250 are removed to expose the sidewalls of the self-aligned polysilicon extending structure 242 and the upper surface of the trenched polysilicon gate 240. Typical selective etching processes can be applied in the present fabrication step. As a preferred embodiment, the selective etching process can be further simplified when both the mask layer 220 and the second spacer 250 are made of silicon oxide.

Figure 2E:
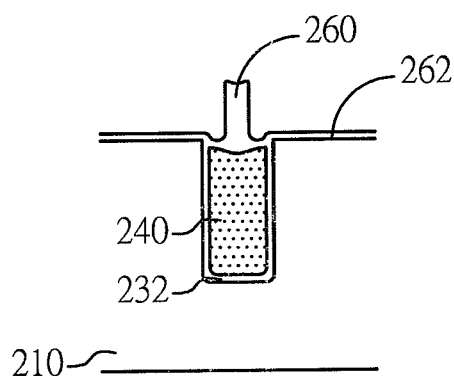

Next, as shown in FIG. 2E, an oxidation process is carried out. The exposed surfaces of the self-aligned polysilicon extending structure 242 and the trenched polysilicon gate 240 are oxidized during this oxidation process and a silicon oxide protruding structure 260 is formed above the trenched polysilicon gate 240. It is noted that because the whole side surface of the self-aligned polysilicon structure 242 are exposed and the width of the self-aligned polysilicon structure 242 is quite small. When the whole self-aligned polysilicon structure 242 is oxidized, only a thin surface region of the trenched polysilicon gate 240 is oxidized. The cross-section area of the trenched polysilicon gate 240 would not be too much influenced by the oxidation process. Moreover, an oxide layer 262 is also formed on the upper surface of the silicon substrate 210 in the present oxidation process to meet the need of the following ion implantation steps.

Figure 2F:
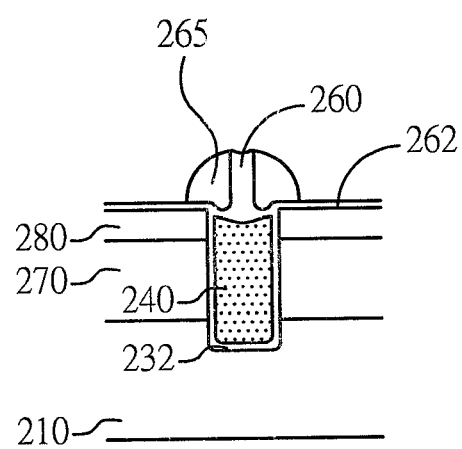

Next, as shown in FIG. 2F, an ion implantation process is carried out to implant dopants of first conductive type into the silicon substrate 210. A body 270 is thus formed in the silicon substrate 210 surrounding the trenched polysilicon gate 240. Thereafter, another ion implantation process is used to implant dopants of second conductive type into the surface region of the silicon substrate 210 so as to foam the source doped region 280 in the upper portion of the body 270. The above mentioned first conductive type and second conductive type may be P-type and N-type or N-type and P-type respectively. Then, as shown in FIG. 2F, a first spacer 265 is formed on the sidewall of the silicon oxide protruding structure 260 to define the location of the source contact window.

Figure 2G:
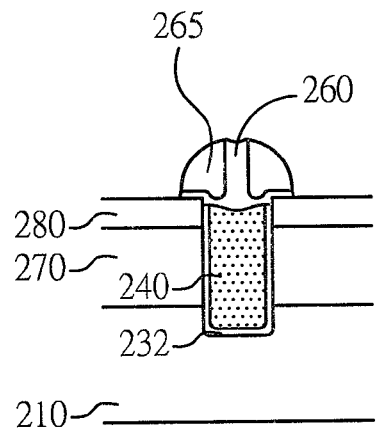
Figure 2H:
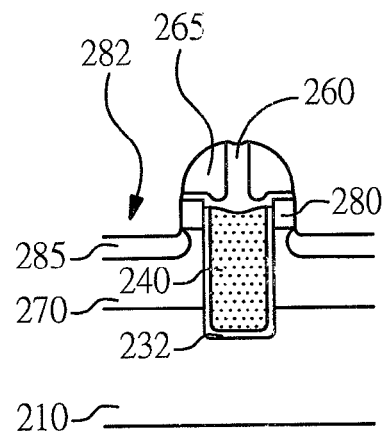
Figure 2I:
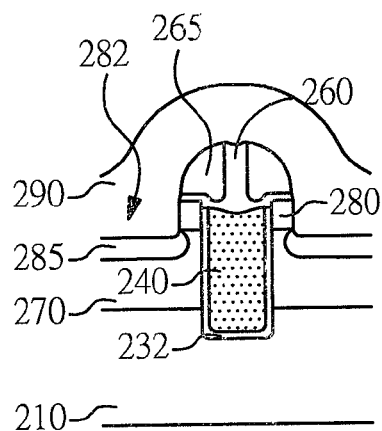

Next, as shown in FIGS. 2G and 2H, by using the first spacer 265 as an etching mask, the oxide layer 262 and a portion of the source region 280 are removed by etching to form a source contact window 282 extending into the silicon substrate 210. Then, as shown in FIG. 2H, an ion implantation process is carried out to implant dopants of first conductive type into the bottom of the source contact window 282 so as to form a heavily doped region 285 in the body 270. Finally, as shown in FIG. 2I, a source metal layer 290 is formed on the silicon substrate 210. The source metal layer 290 is electrically connected to the source region 280 and the body 270.

As mentioned above, because the self-aligned polysilicon extending structure 242 is aligned to the center of the trenched polysilicon gate 240, the silicon oxide protruding structure 260 should be aligned to the center of the trenched polysilicon gate 240 also. Thus, the present embodiment using the first spacer 265 on the sidewall of the silicon oxide protruding structure 260 to define the location of the source contact window 282 is able to prevent alignment error. In addition, in the present embodiment, the distance between the source contact window 282 and the trenched polysilicon gate 240 is mainly decided by the thickness of the first spacer 265, which is irrelevant to the critical dimension of the lithographic process. Moreover, the narrow silicon oxide protruding structure 260 on the trenched polysilicon gate 240 is helpful for reducing the distance between the source contact window 282 and the trenched polysilicon gate 240 to meet the need of high cell density.

Figure 3A:
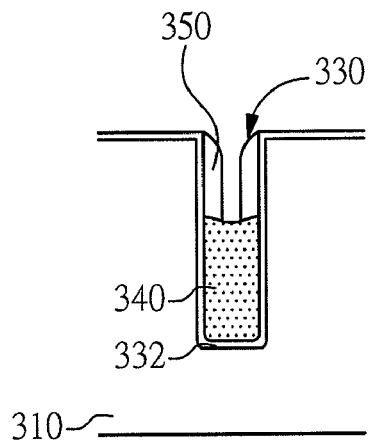
FIGS. 3A to 3C are schematic views showing a fabrication method of a trenched power semiconductor structure in accordance with a second embodiment of the present invention.
Figure 3B:
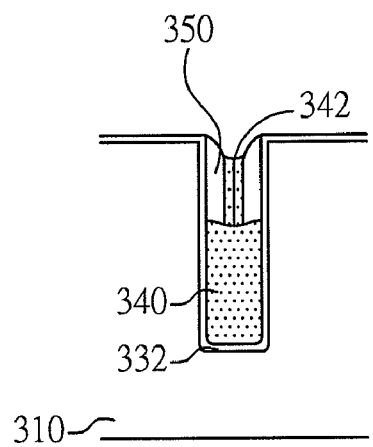
Figure 3C:
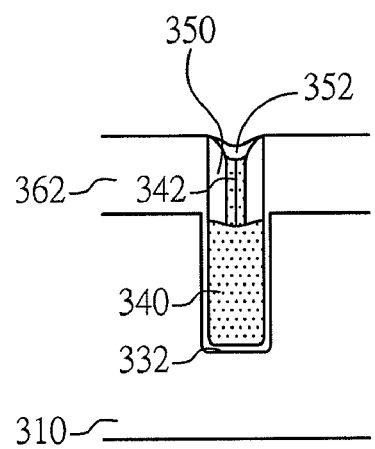

FIGS. 3A to 3C are schematic views showing a fabrication method of a trenched power semiconductor structure in accordance with a second embodiment of the present invention. The difference between the present embodiment and the first embodiment is described below. Firstly, as shown in FIG. 3A, a photo-resist layer (not shown) is used to form a gate trench 330 in the silicon substrate 310. Then, a gate dielectric layer 332 is formed to line the inner surface of the gate trench 330. Afterward, a trenched polysilicon gate 340 is formed in the gate trench 330 by filling polysilicon material into the gate trench 330. As shown, the trenched polysilicon gate 340 is located in the lower portion of the gate trench 330, and a predetermined distance is kept between the upper surface of the trenched polysilicon gate 340 and the upper surface of the silicon substrate 310. Thereafter, a second spacer 350 is formed on the sidewall of the upper portion of the gate trench 330.

Next, as shown in FIG. 3B, a polysilicon layer is deposited to fill the space defined by the second spacer 350 and an etching back process follows to form the self-aligned polysilicon extending structure 342 on the trenched polysilicon gate 340. Thereafter, as shown in FIG. 3C, a protection layer 352 is formed on the upper surface of the self-aligned polysilicon extending structure 342, and then an oxidation process follows. The protection layer 352 is capable to shield the self-aligned polysilicon extending structure 342 from being oxidized in this oxidation process. Thus, only the surface region of the silicon substrate 310 is oxidized, and a thick oxide layer 362 is formed to surround the self-aligned polysilicon extending structure 342. The material, which is able to prevent the diffusion of oxygen atoms, such as silicon nitride and silicon oxide, can be used to form the protection layer 352.

Then, the thick oxide layer 362, the second spacer 350, and the protection layer 352 are removed to expose the self-aligned polysilicon extending structure 342. The self-aligned polysilicon extending structure is now protruded from the upper surface of the silicon substrate 310. When both the second spacer 350 and the protection layer 352 are formed of silicon oxide, a single etching process is able to remove the thick oxide layer 362, the second spacer 350, and the protection layer 352. When both the second spacer 350 and the protection layer 352 are formed of silicon nitride, the thick oxide layer 362 may be removed first by selectively etching, and then the second spacer 350 and the protection layer 352. Certainly, the above mentioned second spacer 350 and the protection layer 352 may be formed of different materials. The following steps of the present embodiment are similar to that of the first embodiment, which are not repeated here.

Figure 4A:
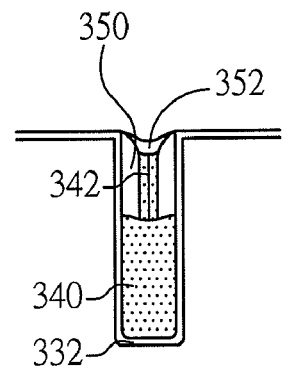
FIGS. 4A and 4B are schematic views showing a fabrication method of a trenched power semiconductor structure in accordance with a third embodiment of the present invention.
Figure 4B:
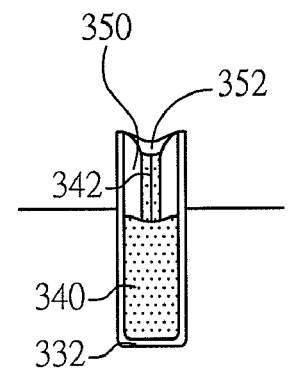

FIGS. 4A and 4B are schematic views showing a fabrication method of a trenched power semiconductor structure in accordance with a third embodiment of the present invention. The difference between the present embodiment and the second embodiment is described below. As shown in FIG. 4A, which follows the step of FIG. 3B, after the formation of the self-aligned polysilicon extending structure 342 on the trenched polysilicon gate 340, the protection layer 352 is formed to shield the upper surface of the self-aligned polysilicon extending structure 342. Then, in contrast with the oxidation process as shown in FIG. 3C, referring to FIG. 4B, an etching process, such as the selective etching process, is directly applied to the silicon substrate 310 with the protection layer 352 and the second spacer 350 as the etching mask. After the etching process, the self-aligned polysilicon extending structure 342 is protruded from the silicon substrate 310. Then, the protection layer 352 and the second spacer 350 are removed to expose the self-aligned polysilicon extending structure 342. The protection layer 352 and the second spacer 350 may be formed of silicon oxide or silicon nitride to facilitate the selective etching process.

In the present embodiment, the protection layer 352 and the second spacer 350 are used as the etching mask for etching the silicon substrate 310. However, according to another embodiment of the present invention, the silicon substrate 310 can be etched by using the anisotropic etching process, such as reactive ion etching (RIE), with merely the protection layer 352 as the etching mask.

Figure 5A:
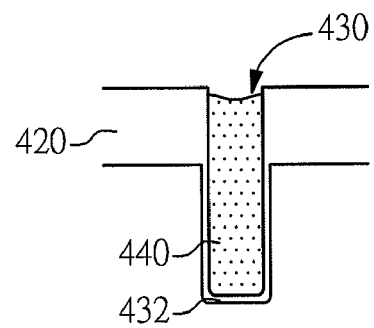
FIGS. 5A to 5D are schematic views showing a fabrication method of a trenched power semiconductor structure in accordance with a fourth embodiment of the present invention.

FIGS. 5A to 5D are schematic views showing a fabrication method of a trenched power semiconductor structure in accordance with a fourth embodiment of the present invention. The difference between the present embodiment and the first embodiment is described below. Firstly, as shown in FIG. 5A, a mask layer 420 is formed on the upper surface of a silicon substrate 410. Then, by using the mask layer 420 as the etching mask, at least a gate trench 430 is formed in silicon substrate 410. Then, a gate dielectric layer 432 is formed to line the inner surface of the gate trench 430. Afterward, a polysilicon layer is deposited on the silicon substrate 410. The polysilicon layer fills the gate trench 430 and the open 422 of the mask layer 420. Thereafter, an etching back process is carried out to remove the unwanted portion of the polysilicon layer and leave a polysilicon structure 440 extended from the gate trench 430 into the open 422 of the mask layer 420.

Figure 5B:
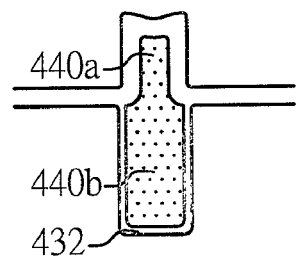
Figure 5C:
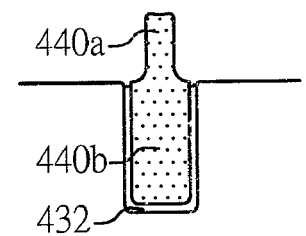

Next, as shown in FIG. 5B, the mask layer 420 is removed to expose the upper portion of the polysilicon structure 440. Then, the exposed surface of the polysilicon structure 440 is oxidized. Thereafter, as shown in FIG. 5C, the oxidized portion of the polysilicon structure 440 is removed such that the width of the upper portion 400a of the polysilicon structure 440 is reduced. As shown, the resulted polysilicon structure 440 has an exposed upper portion 440a and a lower portion located in the silicon substrate 410. The exposed upper portion 440a can be regarded as the self-aligned polysilicon extending structure described in the above mentioned embodiments, and the lower portion 440b can be regarded as the trenched polysilicon gate.

In the present embodiment, the exposed surface of the polysilicon structure 440 is oxidized before the etching step is carried out to reduce the width of the upper portion 440a of the polysilicon structure 440. However, also referring to FIGS. 5A and 5C, according to another embodiment, the exposed polysilicon structure 440 can be etched right after the mask layer 420 is removed, and the oxidation step can be skipped.

Figure 5D:
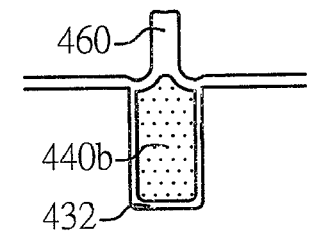

Next, as shown in FIG. 5D, another oxidation process is used to oxidize the whole self-aligned polysilicon extending structure 440a so as to form the silicon oxide protruding structure 460 on the trenched polysilicon gate 440b. The following steps of the present embodiment, which are similar to that as shown in FIGS. 2E to 2I of the first embodiment, are not repeated here.

According to the above mentioned embodiments, the fabrication method of the present invention applies the self-alignment process to overcome the limitation of lithographic process, such that the distance between the trenched polysilicon gate and the source contact window can be reduced. In addition, the fabrication method of the present invention is also helpful for enhancing fabrication yield and is benefit for increasing uniformity of cells on the wafer. Moreover, the fabrication method of the present invention can be easily integrated into the traditional trenched power semiconductor fabrication process, and is especially suitable for the narrow trench process.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

What is claimed is:

1. A fabrication method of a self-aligned power semiconductor structure, comprising the steps of:
    forming a trenched polysilicon gate in a silicon substrate;
    forming a self-aligned polysilicon extending structure, extended upward from the trenched polysilicon gate, a width of the self-aligned polysilicon extending structure being smaller than that of the trenched polysilicon gate;
    oxidizing the self-aligned polysilicon extending structure to form a silicon oxide protruding structure on the trenched polysilicon gate; and
    forming a first spacer on a sidewall of the silicon oxide protruding structure to define a source contact window.

2. The fabrication method of a self-aligned power semiconductor structure of claim 1, wherein the step of forming the trenched polysilicon gate comprises:
    forming a mask layer, which has an open to define a gate trench, on an upper surface of the silicon substrate;
    etching the silicon substrate through the mask layer to form the gate trench;
    forming a gate dielectric layer to line an inner surface of the gate trench; and
    filling polysilicon material into the gate trench.

3. The fabrication method of a self-aligned power semiconductor structure of claim 2, wherein the step of forming the self-aligned polysilicon extending structure comprises:
    forming a second spacer on a sidewall of the open of the mask layer; and
    filling polysilicon material into the open to form the self-aligned polysilicon extending structure.

4. The fabrication method of a self-aligned power semiconductor structure of claim 3, wherein the second spacer is formed of silicon oxide or silicon nitride.

5. The fabrication method of a self-aligned power semiconductor structure of claim 2, wherein the mask layer is formed of silicon oxide.

6. The fabrication method of a self-aligned power semiconductor structure of claim 1, wherein the whole self-aligned polysilicon extending structure is oxidized to form the silicon oxide protruding structure protruded from the silicon substrate.

7. The fabrication method of a self-aligned power semiconductor structure of claim 1, wherein an upper surface of the trenched polysilicon gate is oxidized in the step of oxidizing the self-aligned polysilicon extending structure.

8. The fabrication method of a self-aligned power semiconductor structure of claim 2, wherein the polysilicon material is filled into the gate trench and the open to form a polysilicon structure having a lower portion as the trenched polysilicon structure, and the step of forming the self-aligned polysilicon extending structure comprises:
    removing the mask layer to expose an upper portion of the polysilicon structure; and
    reducing a width of the upper portion of the polysilicon structure by etching to form the self-aligned polysilicon extending structure.

9. The fabrication method of a self-aligned power semiconductor structure of claim 2, wherein the step of reducing a width of the upper portion comprises:
oxidizing the upper portion to form an oxide layer thereon; and
removing the oxide layer to form the self-aligned polysilicon extending structure protruded from the silicon substrate.

10. The fabrication method of a self-aligned power semiconductor structure of claim 1, wherein the step of forming the trenched polysilicon gate comprises:
forming a gate trench in the silicon substrate via a photoresist layer;
forming a gate dielectric layer to line an inner surface of the gate trench; and
filling polysilicon material into the gate trench to form the trenched polysilicon gate in a lower portion of the gate trench.

11. The fabrication method of a self-aligned power semiconductor structure of claim 10, wherein the step of forming the self-aligned polysilicon extending structure comprises:
forming a second spacer on a sidewall of an upper portion of the gate trench;
filling polysilicon material into the upper portion of the gate trench to form the self-aligned polysilicon extending structure;
forming a protection layer to shield the self-aligned polysilicon extending structure; and
etching an upper surface of the silicon substrate to have the self-aligned polysilicon extending structure protruded from the silicon substrate.

12. The fabrication method of a self-aligned power semiconductor structure of claim 11, wherein the step of etching the upper surface of the silicon substrate comprises:
oxidizing the upper surface of the silicon substrate to form a thick oxide layer; and
removing the thick oxide layer to have the self-aligned polysilicon extending structure protruded from the silicon substrate.

13. The fabrication method of a self-aligned power semiconductor structure of claim 11, wherein the step of etching the upper surface of the silicon substrate uses the protection layer as an etching mask.

* * * * *

UNITED STATES PATENT AND TRADEMARK OFFICE
CERTIFICATE OF CORRECTION

PATENT NO. : 8,283,230 B2
APPLICATION NO. : 12/797898
DATED : October 9, 2012
INVENTOR(S) : Chun Ying Yeh Page 1 of 1

It is certified that error appears in the above-identified patent and that said Letters Patent is hereby corrected as shown below:

On the Title Page:

Change Item (76) to Item (75) on the Title Page, after adding Item (73) Assignee.

Please add Item (73) Assignee, as follows:

--(73) Assignee: Great Power Semiconductor Corp., Xizhi City, Taipei County (TW)--

Signed and Sealed this
Third Day of September, 2013

Teresa Stanek Rea
*Acting Director of the United States Patent and Trademark Office*